(12) United States Patent
Krug et al.

(10) Patent No.: US 8,063,668 B2
(45) Date of Patent: Nov. 22, 2011

(54) OUTPUT STAGE, AMPLIFIER CONTROL LOOP AND USE OF THE OUTPUT STAGE

(75) Inventors: Erwin Krug, München (DE); Horst Klein, Markt Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 1244 days.

(21) Appl. No.: 11/286,562

(22) Filed: Nov. 23, 2005

(65) Prior Publication Data
US 2006/0125522 A1    Jun. 15, 2006

(30) Foreign Application Priority Data

Nov. 25, 2004 (DE) .......................... 10 2004 057 009
Nov. 14, 2005 (DE) .......................... 10 2005 054 216

(51) Int. Cl.
*H03K 5/22* (2006.01)
*H03K 5/153* (2006.01)

(52) U.S. Cl. ................ 327/77; 327/65; 327/66; 327/88; 327/89

(58) Field of Classification Search ........................ None
See application file for complete search history.

(56) References Cited

U.S. PATENT DOCUMENTS

| | | | | |
|---|---|---|---|---|
| 4,152,663 A | * | 5/1979 | Van de Sande | 330/253 |
| 5,109,170 A | * | 4/1992 | Huijsing et al. | 327/538 |
| 5,291,149 A | * | 3/1994 | Nunoshima | 330/255 |
| 5,473,243 A | * | 12/1995 | Thomas | 323/315 |
| 5,729,177 A | | 3/1998 | Goutti | |
| 5,742,203 A | * | 4/1998 | Van De Plassche et al. | 330/254 |
| 5,801,564 A | * | 9/1998 | Gasparik | 327/170 |
| 5,834,974 A | * | 11/1998 | Kim | 330/253 |
| 5,963,062 A | * | 10/1999 | Fujii | 327/74 |
| 6,060,940 A | * | 5/2000 | Chiozzi | 327/437 |
| 6,313,667 B1 | | 11/2001 | Eschauzier | |
| 6,583,995 B2 | * | 6/2003 | Kalman et al. | 363/35 |
| 6,798,292 B1 | * | 9/2004 | Viswanathan | 330/257 |

FOREIGN PATENT DOCUMENTS
WO    WO 02/15390 A1    2/2002

OTHER PUBLICATIONS

*Advanced Electronic Circuits*, U. Tietze and CH. Schenk, Sep. 1978, Preface and pp. 156-163.

* cited by examiner

*Primary Examiner* — Tuan T Lam
(74) *Attorney, Agent, or Firm* — Eschweiler & Associates, LLC

(57) ABSTRACT

An output stage includes a first transistor pair with a first conductivity type and a second transistor pair with a second conductivity type. The source connections of the first and second transistors in the first transistor pair and of the first and second transistors in the second transistor pair are respectively connected to a first and a second circuit node. The output stage further includes a first current mirror with the first conductivity type and a second current mirror with the second conductivity type. The current mirror transistors are connected to the signal output. The signal input is connected to control connections of the first transistors in the first and second transistor pairs. A second connection of the second transistor in the first transistor pair is connected to the second current mirror, and a second connection of the second transistor in the second transistor pair is connected to the first current mirror.

18 Claims, 4 Drawing Sheets

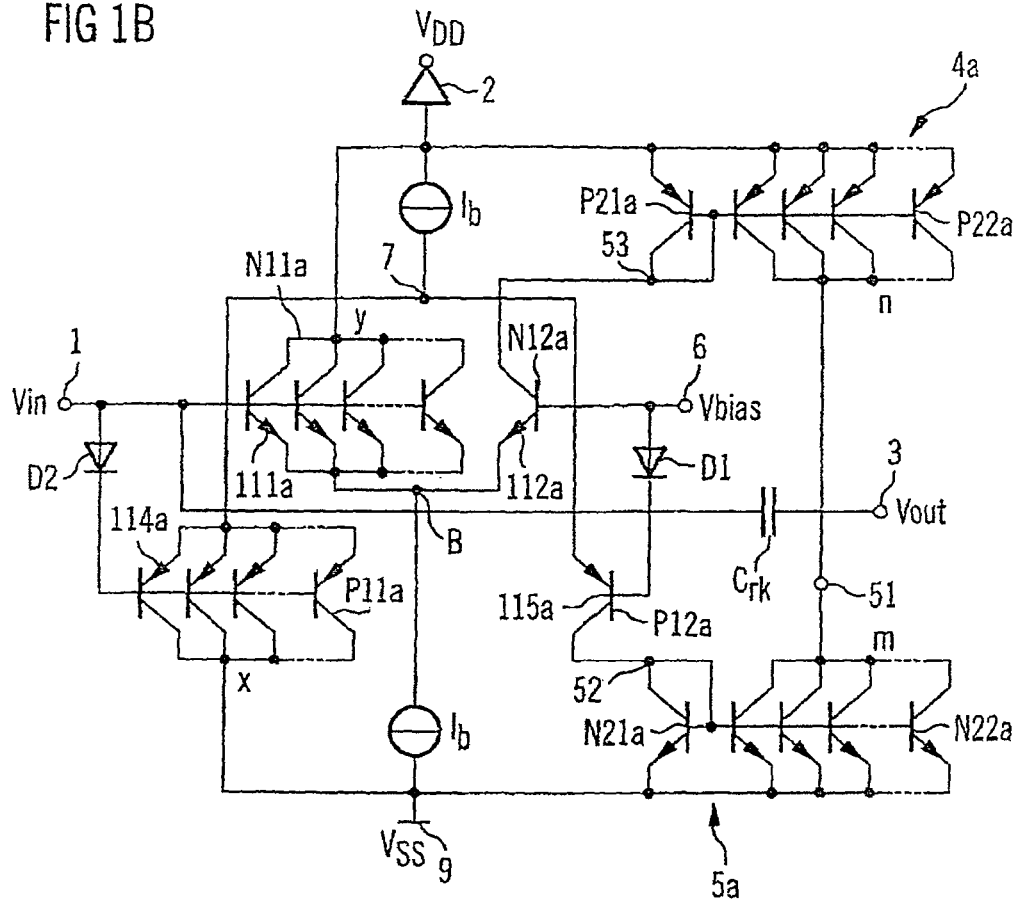
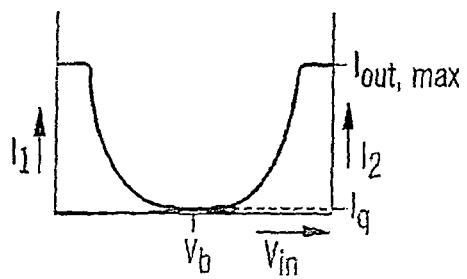

OUTPUT STAGE, AMPLIFIER CONTROL LOOP AND USE OF THE OUTPUT STAGE

REFERENCE TO RELATED APPLICATIONS

This application claims the benefit of the priority dates of German applications DE 10 2004 057 009.4, filed on Nov. 25, 2004, and DE 10 2005 054 216.6, filed on Nov. 14, 2005, the contents of which are herein incorporated by reference in their entirety.

FIELD OF THE INVENTION

The invention relates to an output stage and to an amplifier control loop with the output stage. The invention also relates to a use for the output stage.

BACKGROUND OF THE INVENTION

Output stages are part of the amplifier circuits and are counted among the most important basic circuits in analog circuitry.

Output stages can be distinguished further using various characteristics, for example, by their small-signal gain response. An exemplary embodiment of a normal-mode AB output stage is shown in prior art FIG. 5. The output stage shown comprises two series-connected field effect transistors of different conductivity type. Specifically, one connection of a p-channel field effect transistor 900 is connected to a supply potential VDD and its other connection is connected to the output 905. Connected in series with this is an n-channel field effect transistor 901. The two field effect transistors 900 and 901 are actuated in antiphase by a normal-mode signal $V_{IN}$ at the signal connection 902.

To set the operating point, there is additionally provided a voltage source 904 which is connected to the control connections of the two transistors for the purpose of setting the operating point of the normal-mode AB output stage. In this case, the operating point is chosen such that over the entire input and output voltage range there is a gain in a respective one of the two field effect transistors.

FIG. 6 shows the dependency of the two currents $I_1$ and $I_2$ flowing through the transistors on the input voltage $V_{IN}$. To reduce distortions in small-signal operation around the operating point $V_0$, the diodes are used to set the quiescent output current $I_Q$ such that it is always greater than zero. A drawback is the great dependency of the output current on the supply voltage and external parameters which cannot be influenced. These include the temperature, for example. If the voltage supply $V_{DD}$ fluctuates and is not constant, these are transferred directly to the response of the circuit shown in prior art FIG. 5. The problem also arises if the voltage for setting the operating point is derived from the supply voltage. There is no provision for the output current $I_{out}$ to be limited in the class AB output stage shown in FIG. 5.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to an amplifier and particularly an output stage whose quiescent output current is small and which concurrently has a defined maximum output current.

According to one embodiment of the invention, the output stage comprises not only a signal input, an actuating input and a signal output, but also a first transistor pair with a first conductivity type and a second transistor pair with a second conductivity type. A respective first connection of a first and a second transistor in the first transistor pair is connected to a first circuit node. A respective first connection of a first and a second transistor in the second transistor pair is connected to a second circuit node. In addition, a first current mirror with transistors of the first conductivity type and a second current mirror with transistors of the second conductivity type are provided. The current mirror transistors in the first and second current mirrors are connected to the signal output.

The signal input of the output stage is connected to a control connection of the first transistor in the first transistor pair and to a control connection of the first transistor in the second transistor pair. At the same time, the actuating input of the output stage is coupled to control connections of the respective second transistors in the first and second transistor pairs. A second connection of the second transistor in the first transistor pair is connected to the second current mirror, and a second connection of the second transistor in the second transistor pair is connected to the first current mirror.

In accordance with an aspect of the invention, the first and second transistor pairs form differential amplifiers that are respectively arranged so as to complement one another and which are also called current balances. The design of the arrangement with likewise complementary current mirrors and the special crossed interconnection of the current mirrors and the output connections of the differential amplifiers allow precise setting of a quiescent output current and of a maximum output current while concurrently providing a large degree of independence from the supply voltage. Since the output is also produced with current mirrors, a residual output voltage is reduced. The output stage can thus also be operated at voltages close to the supply voltages.

In one embodiment of the invention, the signal input is coupled to the signal output via a charge store. The charge store advantageously produces a suitable phase rotation and improves the stability of the entire arrangement.

In another embodiment, the first transistor pair is produced with p-channel field effect transistors and the second transistor pair is produced with n-channel field effect transistors. In another aspect of the invention, the second transistor in the first transistor pair has an associated geometric parameter comprising a channel width and a channel length. The second transistor is thus produced with a known and predetermined channel width and channel length, where the channel width and channel length form a geometric parameter. In one example, this geometric parameter differs from a geometric parameter of the first transistor in the first transistor pair by a first factor.

In one embodiment, at least one of the transistor pairs is produced with bipolar transistors. These may be pnp or else npn bipolar transistors. In one aspect of the invention, the respective first transistors in the two transistor pairs have different emitter areas than the respective second transistor. These emitter areas comprise a geometric parameter of the transistors in the transistor pair.

In one embodiment, the geometric parameter of the second transistor is smaller by a first factor than the geometric parameter of the first transistor in the first transistor pair. The different geometric parameters allow the quiescent output current to be reduced.

In another embodiment of the invention, the first and second transistors in the second transistor pair are also produced with a predetermined channel width and a channel length. The transistors thus have an associated geometric parameter comprising a channel width and a channel length. These geometric parameters also differ by a factor. The factor in one example is greater than one, is in the range from 1 to 100, for example, and in one advantageous embodiment has the value 24.

In still another embodiment of the invention, the first and second current mirrors respectively contain a transistor and the current mirror transistor. The transistors and the current mirror transistors have a respective associated geometric parameter which is derived from the geometric dimensions of the transistors and the current mirror transistors. The geometric parameter of the mirror transistor in the first and second current mirrors is greater by a known factor than the geometric parameter of the transistors. This means that it is possible to use a small current through the differential amplifiers to produce a high output current from the two transistor pairs in the inventive output stage.

In one embodiment, the transistor and the current mirror transistor are respectively produced with bipolar transistors. These can have different emitter areas as geometric parameters.

The maximum output current is then limited by the current which flows through the differential amplifiers, multiplied by the factor which is obtained from the ratio of the two geometric parameters of the transistors and of the current mirror transistors. The transformation ratio of the first and second current mirrors, which is indicated by the factor, thus allows a high output current to be produced with a concurrently low drawn input current.

In one example, the output stage can be used in an amplifier control loop, where the amplifier control loop contains a third transistor pair with the first conductivity type and a fourth transistor pair with the second conductivity type. A second signal input is connected to a control connection of a first transistor in the third and fourth transistor pairs. The signal output of the output stage is connected to a control connection of the second transistor in the third and fourth transistor pairs to form a feedback path. In addition, a connection of the first transistors in the third and fourth transistor pairs is coupled to the signal input of the output stage.

The invention in one embodiment thus forms an amplifier control loop which has a very small quiescent output current with simultaneously maximum output current defined by the complementary balance circuits and the complementary current mirrors.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below using exemplary embodiments with reference to the drawings, in which:

FIG. 1B is a schematic diagram illustrating another exemplary embodiment of the output stage with bipolar transistors according to the present invention, FIG. 2 is a characteristic curve illustrating the output currents as a function of the input voltage.

DETAILED DESCRIPTION OF THE INVENTION

Figure 1A:
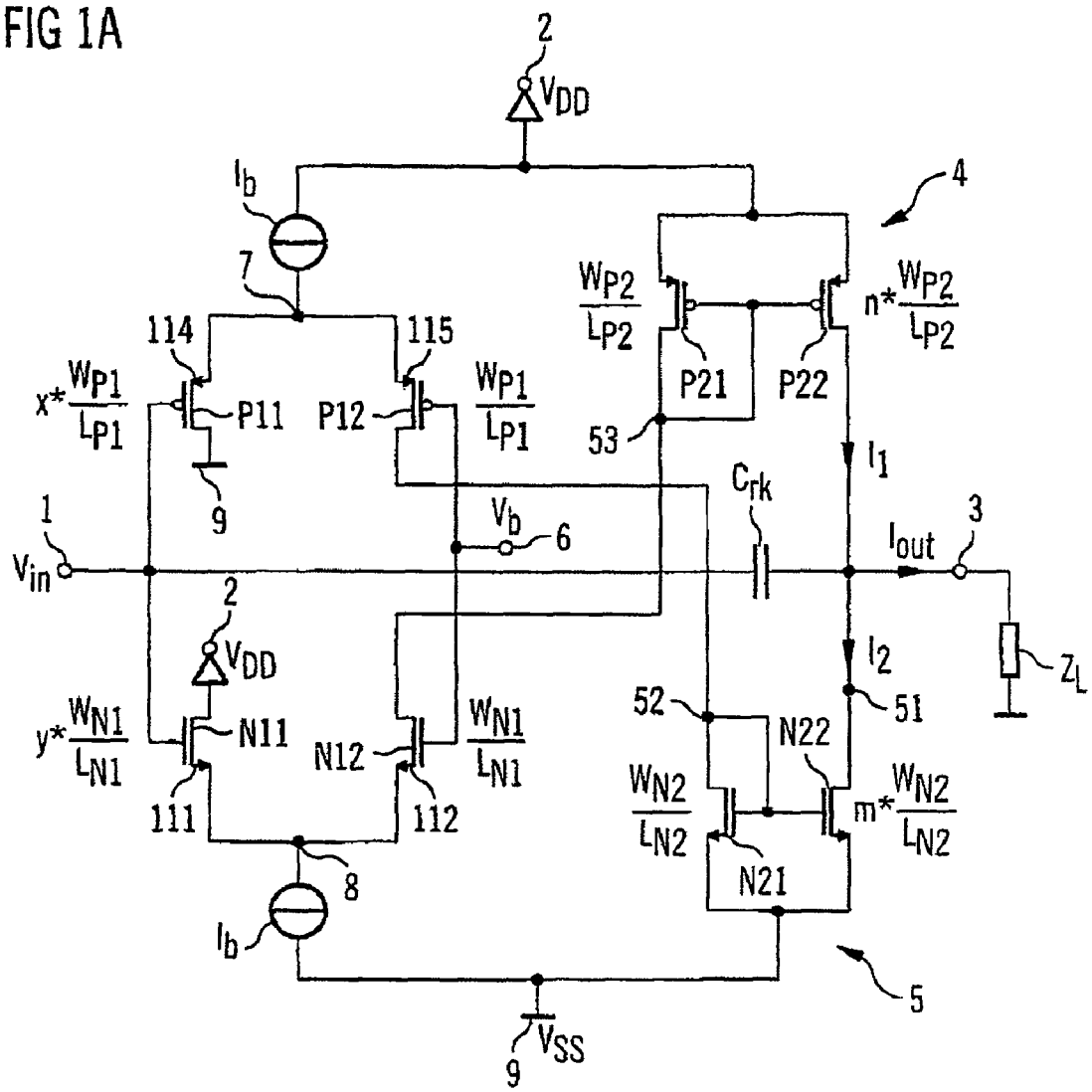
FIG. 1A is a schematic diagram illustrating an exemplary embodiment of the output stage according to the present invention.

FIG. 1 shows an inventive output stage which is implemented in CMOS technology. The output stage contains a signal input 1 for supplying a single-ended voltage signal $V_{IN}$. The signal input is connected to the control connection of a p-channel field effect transistor P11 in a first transistor pair and to the control connection of a first n-channel field effect transistor N11 in a second transistor pair. The first transistor pair and the second transistor pair are differential amplifiers, respectively. The control connections of the second transistors P12 and N12 in the first and second transistor pairs are connected to an actuating input 6. This has a bias potential $V_b$ applied to it in order to set the operating point of the inventive output stage.

The source connections 114 and 115 of the two p-channel field effect transistors P12 and P11 in the first transistor pair are connected together at the node 7. The node 7 is connected to a supply connection 2 via a current source $I_b$ in order to supply a supply potential $V_{DD}$. The drain connection of the transistor P11 is routed to a connection 9 for a reference potential $V_{SS}$.

In the same way, the source connections 111 and 112 of the first and second transistors N11, N12 are connected to a common node 8. This is routed via a current source $I_b$ to the connection 9 for the reference potential $V_{SS}$. The second connection of the first transistor N11 is connected to the supply potential connection 2 and hence to the supply potential $V_{DD}$.

The p-channel field effect transistors P11 and P12 are produced with a particular channel width $W_{P1}$ and a particular channel length $L_{P1}$. Accordingly, the n-channel field effect transistors are also produced with a particular channel length $L_{N1}$ and a particular channel width $W_{N1}$. The width-to-length W/L ratio of the channel forms a characteristic geometric parameter and is called the transconductance coefficient. This is a measure of the gradient of the transfer characteristic of a field effect transistor. In addition, the geometric parameter also influences the current flowing through the field effect transistor at a prescribed voltage.

The geometric parameters of the transistors P11 and N11 differ from those of the transistors P12 and N12 by the factors x and y. In the present exemplary embodiment, the additional factors x and y have a value significantly greater than 1. The factor is 24, for example, but may also assume other values, for example in the range from 1 to 100. In FIG. 1, the ratio of the channel width to the channel length is indicated next to the transistors.

The different geometric parameters between the transistors P11 and P12, and N11 and N12, result in a different flow of current through the two transistors in the respective differential amplifiers. For the same input voltage $V_{IN}$ and control voltage $V_b$, the different geometric parameter thus results in an asymmetric split for the current $I_b$ flowing through the transistor pairs. This makes the quiescent output current $I_Q$ for the entire output stage very small. Specifically, the transistor P11 in the first pair and the transistor N11 in the second pair have a current flowing through them which is greater by the factor x or y than that flowing through the corresponding transistors P12 and N12.

The drain connection of the transistor P12 is connected to a current mirror 5. This comprises two n-channel field effect transistors N21 and N22. Their source connections connect them to the connection 9. The current mirror mirrors a current coming from the transistor P12 in the transistor N22. The second connection of the current mirror transistor N22 is routed to the signal output 3. A tap 52 is connected to the control connections of the two transistors N21 and N22.

Equally, the drain connection of the transistor N12 is routed to a current mirror 4, which is produced with two p-channel field effect transistors P21 and P22. The tap 53 connects the control connections of the two p-channel field effect transistors P21 and P22 to the second connection of the transistor N12. A source connection of the current mirror transistor P22 together with the transistor P21 is connected to the supply connection 2 in order to supply the supply potential $V_{DD}$. The second connection of the current mirror transistor P22 is connected to the signal output 3. In the exemplary embodiment, a complex load $Z_L$ is connected to ground at the signal output 3.

The transistors in the current mirror also respectively contain asymmetric geometric parameters comprising the ratio of the channel width $W_{P2}$ to the channel length $L_{P2}$ or of the channel width $W_{N2}$ to the channel length $L_{N2}$. Specifically, the current mirror transistors P22 and N22 have a geometric parameter which is greater by the factor n or m. The different geometric parameter influences the current mirroring. With the same geometric parameter, the same current is also mirrored in the current mirror transistors P22 and N22. The ratio which is greater by the factor m or n results in a flow of current through the current mirror transistors P22 and N22 which is greater by this factor.

The design using the two current mirrors 4 and 5 whose inputs are coupled to the outputs of the transistor pairs operating as fast differential amplifiers achieves output current limiting. The maximum output current $I_{OUT,max}$ is set by the current $I_b$ in one of the complementary balance circuits and the current mirror ratio n or m. The output currents $I_1$ and $I_2$ in the two current mirror paths of the current mirrors 4 and 5 as a function of the input voltage are shown by the graph in FIG. 2.

Figure 6:
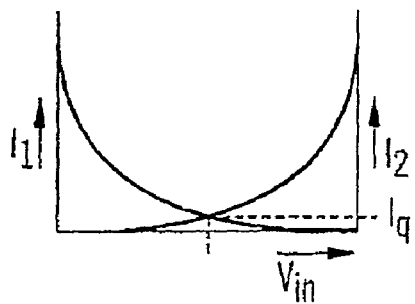
FIG. 6 is a characteristic curve illustrating an output current as a function of the input current for the prior art output stage of FIG. 5.

In the region of high input signals, the output current accordingly becomes saturated. At the same time, it is possible to see a defined setting for the quiescent output current $I_Q$ and for the maximum output current in comparison with conventional class AB amplifiers as shown in prior art FIG. 6. The quiescent output current $I_Q$ is obtained from the ratio of the defined current $I_b$ multiplied by the current mirror ratio n, m and divided by the transconductance coefficient ratio x, y. For equal ratios m, n and x, y, the following is true:

$$I_Q \approx I_b * n/x$$

The current mirror ratios n and m are therefore, in one example, the same in magnitude and are in a transformation ratio in the range from 1 to 200. Other values may also be set, however, and such variations are contemplated as falling within the scope of the present invention.

FIG. 1B shows another embodiment of the inventive output stage which is implemented with bipolar transistors according to the present invention. Components which have the same action or function bear the same reference symbols. In this embodiment, the first transistor pair P11a, P12a is produced with respective pnp bipolar transistors. In this case, the first transistor P11a comprises a plurality of parallel-connected bipolar transistors with the same emitter area. In this context, the emitter area of each of the parallel-connected bipolar transistors is the same size as the emitter area of the bipolar transistor P12a. With a total of X pnp bipolar transistors arranged in parallel, the total emitter area of the transistor P11a accordingly corresponds to x times the emitter area of the bipolar transistor P12a. The control connection of the bipolar transistor P11a is connected to the signal input 1 via a diode D2. In the same way, the control connection of the bipolar transistor P12a is connected via a diode D1 to the actuating input 6 in order to supply the BIOS potential $V_{BIOS}$. The two diodes D1, D2 are required for the implementation shown here with pnp bipolar transistors in order to match the operating point to a voltage supply in the region of 3 V. In other embodiments using other supply voltages or voltages for setting the operating point, the diodes D1, D2 can be dispensed with.

The second transistor pair with the transistors N11a, N12a is produced with npn bipolar transistors. In this case, the transistor N11a again comprises a plurality of single npn bipolar transistors arranged in parallel. The emitter area of each individual npn bipolar transistor in the transistor N11a again corresponds to the emitter area of the npn bipolar transistor N12a. With a total of Y bipolar transistors arranged in parallel, the total emitter area of the transistor N11a is greater by the factor y than the emitter area of the bipolar transistor N12a. As a result of a plurality of bipolar transistors arranged in parallel being implemented, the total geometric parameter (in this case the emitter area) may thus vary accordingly. The different emitter area between the transistors N11a, N12a and P11a, P12a result in different flows of current through the transistors in the respective differential amplifiers. An identical input voltage $V_{IN}$ and control voltage $V_{BIAS}$ therefore result in an asymmetric split for the current flowing through the transistors. In this case too, the quiescent output current $I_Q$ of the inventive output stage becomes accordingly small.

The current mirror transistors in the current mirrors 4A and 5A are also produced in the same way. The current mirror 5A comprises npn bipolar transistors. In this case, the current mirror transistor N22a is again produced with a plurality of npn bipolar transistors arranged in parallel, which results in the m-fold emitter area for the transistor N21a. In the same way, the current mirror transistor P22a in the current mirror 4A comprises a total of n pnp bipolar transistors arranged in parallel, the total number of which make up the current mirror transistor. The emitter area of the current mirror transistor is accordingly n times the emitter area of the transistor P21a. In this case too, the different geometric parameter influences the current mirroring. A correspondingly larger ratio results in a flow of current which is greater by this factor.

In the embodiment of the invention shown, which is in no way restrictive, the ratios of the factors x, y and n, m are set to be the same. Naturally, it is possible to select different values for the individual geometric parameters x, y and m, n in this case too, so that extensive flexibility is ensured overall. The additional capacitor $C_{RK}$ between the output connection 3 and the input connection 1 allows additional linearization of the output signal.

Figure 3:
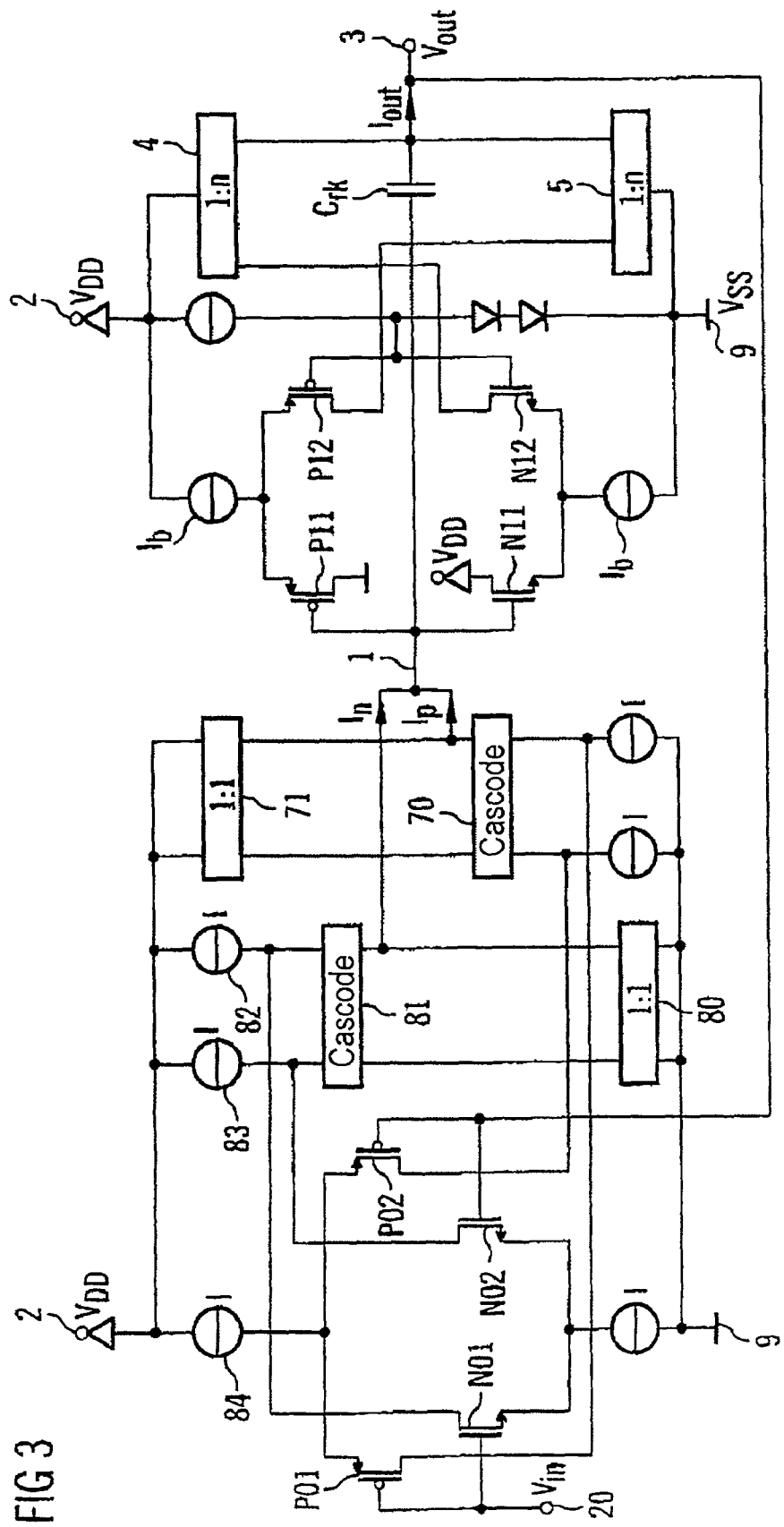
FIG. 3 is an exemplary embodiment of an amplifier control loop according to still another embodiment of the present invention.

A use for the invention in the form of a feedback power amplifier is shown in FIG. 3.

Components which have the same function or action bear the same reference symbols. The input of the output stage is supplied with a normal-mode current signal containing the two components $I_n$ and $I_p$. The capacitor $C_{RK}$ produces a phase rotation and is used to stabilize the inventive output stage. To set the operating point, the control connections of the field effect transistors P12 and N12 are connected to a current source $I_b$ and via two forward-biased diodes to the reference potential connection. The two forward-biased diodes derive the bias potential $V_b$ from a reference potential $V_{SS}$ at the connection 9. Disturbances on the supply potential $V_{DD}$ thus barely have any effect on the output signal.

The amplifier control loop contains a signal input 20 for supplying an input signal $V_{IN}$ which is connected to the control connections of the field effect transistors P01 and N01. These are part of a complementary differential amplifier pair comprising the transistor pairs P01, P02 and N01, N02. The drain connections of the two field effect transistors N01 and N02 are connected to the reference potential connection 9 via a current source I. The respective second connections are routed to nodes between a cascode circuit 81 and the current sources 82 and 83. The current sources are likewise connected to supply connection 2.

On the source side, the cascode circuit is connected to a current mirror 80 which has a current transformation ratio of 1:1 and which is coupled to the connection 9.

The source connections of the two field effect transistors P01 and P02 are together connected via a current source I 84 to the supply potential VDD. The drain connections are routed to a cascode circuit 70, which for its part is connected to the supply potential VDD via a current mirror 71 with the transformation ratio 1:1. The cascode circuits 70 and 81 are required for setting the operating point of the input transistors. Taps between the cascode circuits 81 and 70 and the current mirrors 71 and 80 route the current signals $I_n$ and $I_P$ to the signal input 1 of the output stage.

Figure 4A:
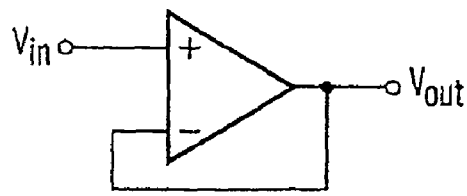
FIG. 4A is a schematic block diagram of the control loop of FIG. 3.
Figure 4B:
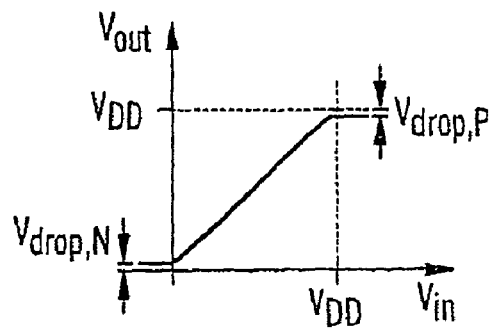
FIG. 4B is a characteristic curve illustrating an output voltage as a function of the input voltage.
Figure 5:
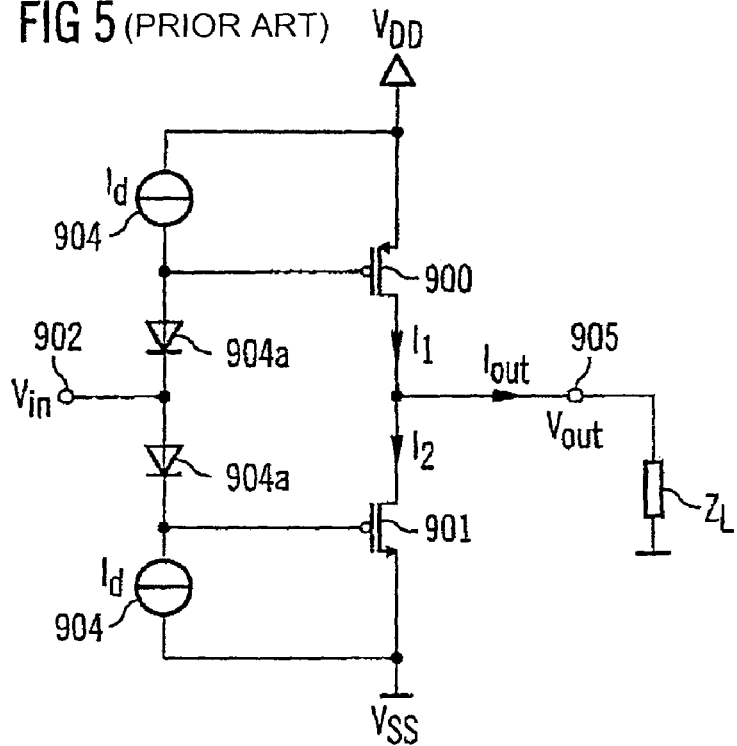
FIG. 5 is a schematic diagram illustrating a prior art normal-mode AB output stage.

The amplifier loop shown in FIG. 3 forms a feedback operational amplifier, whose block diagram can be seen in FIG. 4A. The inverting input "−" is provided by the two control connections of the transistors P02 and N02. In the graph shown in FIG. 4B, it can clearly be seen that the residual output voltage $V_{drop,P}$ or $V_{drop,N}$ differs only slightly from zero or the supply voltage $V_{DD}$. The inventive amplifier control loop which forms the operational amplifier can thus be operated up to a voltage close to the supply voltage.

The inventive output stage can be used preferably in (low-power) amplifier circuits and particularly, as FIG. 3 shows, in operational amplifiers on account of the small quiescent current, whose operating point can be set in defined fashion, and when outputting the maximum output current, which can be set in defined fashion. The exemplary embodiments illustrated here can also be produced with bipolar transistors or with a combination of field effect and bipolar transistors.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An output stage, comprising:
a signal input, an actuating input, and a signal output;
a first transistor pair with a first conductivity type, where a respective first connection of a first transistor and of a second transistor in the first transistor pair is connected to a first circuit node;
a first current source connected to the first circuit node;
a second transistor pair with a second conductivity type, where a respective first connection of a first transistor and of a second transistor in the second transistor pair is connected to a second circuit node;
a second current source connected to the second circuit node;
a first current mirror with a current mirror transistor of the first conductivity type connected to the signal output; and
a second current mirror with a current mirror transistor of the second conductivity type connected to the signal output,
wherein the signal input is connected to control connections of the first transistors in the first and second transistor pairs, the actuating input is connected to control connections of the second transistors in the first and second transistor pairs, a second connection of the second transistor in the first transistor pair is connected to the second current mirror, and a second connection of the second transistor in the second transistor pair is connected to the first current mirror, and
wherein second connections of the first transistor in each of the first and second transistor pairs are coupled to respective, different supply terminals.

2. The output stage of claim 1, further comprising a charge store coupled between the signal input and the signal output.

3. The output stage of claim 1, wherein the first and second current mirrors are formed with bipolar transistors.

4. The output stage of claim 3, wherein an emitter area of the current mirror transistor in the first and second current mirrors is larger by a factor than an emitter area of a further transistor in the first and second current mirrors, respectively.

5. The output stage of claim 1, wherein the first transistor pair comprise p-channel field effect transistors and the second transistor pair comprise n-channel field effect transistors.

6. The output stage of claim 5, wherein the first transistor in the first transistor pair has a channel width and a channel length whose ratio forms a geometric parameter, and wherein the geometric parameter differs from a geometric parameter formed from a channel width and a channel length of the second transistor in the first transistor pair by a first factor that is greater than 1.

7. The output stage of claim 6, wherein the first transistor in the second transistor pair has a channel width and a channel length whose ratio forms a geometric parameter, and wherein the geometric parameter differs from a geometric parameter formed from a channel width and a channel length of the second transistor in the second transistor pair by a second factor that is greater than 1.

8. The output stage of claim 1, wherein at least one of the first and second transistor pairs comprise bipolar transistors.

9. The output stage of claim 8, wherein the first transistor pair comprises pnp bipolar transistors and the second transistor pair comprises npn bipolar transistors.

10. The output stage of claim 9, wherein an emitter area of the first transistor in the first transistor pair differs by a factor greater than 1 from an emitter area of the second transistor in the first transistor pair.

11. The output stage of claim 9, wherein an emitter area of the first transistor in the second transistor pair differs by a factor greater than 1 from an emitter area of the second transistor in the second transistor pair.

12. The output stage of claim 7, wherein the first factor and the second factor are the same.

13. The output stage claim 1, wherein:
the first current mirror comprises another transistor with the first conductivity type whose control connection is connected to a control connection of the current mirror transistor in the first current mirror;
the second current mirror comprises another transistor with the second conductivity type whose control connection is connected to a control connection of the current mirror transistor in the second current mirror;
the another transistors and the current mirror transistors have a respective associated geometric parameter which is derived from geometric dimensions of the respective transistors and current mirror transistors; and
the geometric parameter of the current mirror transistor in the first and second current mirrors is greater by a factor than the geometric parameter of the another transistors.

14. The output stage of claim 1, wherein the first circuit node is coupled to a supply potential, and the second circuit node is coupled to a reference potential.

15. The output stage of claim 1, wherein a second connection of the first transistor in the first transistor pair is connected to a supply potential, and a second connection of the first transistor in the second transistor pair is connected to a reference potential.

16. An output stage, comprising:
first and second differential amplifier circuits each coupled between a signal input and an actuating input, wherein each of the first and second differential amplifier circuits comprise asymmetric transistor pairs, wherein an output current in one transistor of each transistor pair is less than a current in the other transistor of the respective transistor pair; and
first and second current mirror circuits coupled to the second and first differential amplifier circuits, respectively, wherein each of the first and second current mirror circuits comprise asymmetric transistor pairs, wherein a first current mirror transistor of each current mirror circuit is coupled to the output current transistor of the respective differential amplifier circuit, and wherein a second current mirror transistor of each current mirror circuit is coupled together to form a signal output, and further wherein a current in each second current mirror transistor is greater than a current in the respective first current mirror transistor,
wherein the asymmetric transistor pair of the first differential amplifier circuit comprises transistors of a first conductivity type and the asymmetric transistor pair of the second differential amplifier circuit comprises transistors of a second conductivity type, and wherein the asymmetric transistor pair of the first current mirror circuit comprises transistors of the first conductivity type and the asymmetric transistor pair of the second current mirror circuit comprises transistors of the second conductivity type, and
wherein the other transistor in each of the asymmetric transistor pairs in the first and second differential amplifier circuits are coupled to respective, different supply terminals.

17. The output stage of claim 16, wherein each asymmetric transistor pair comprises transistors of different sizes.

18. The output stage of claim 17, wherein an amount of difference in the sizes of the transistors in the asymmetric transistor pairs of the first and second differential amplifier circuits dictate an amount of quiescent current in the output stage, and an amount of difference in the sizes of the transistors in the asymmetric transistor pairs of the first and second current mirror circuits dictate a maximum current limit of the output stage.

* * * * *